United States Patent
Baran et al.

(10) Patent No.: US 10,390,456 B2
(45) Date of Patent: Aug. 20, 2019

(54) CONTROLLER WITH FAN MONITORING AND CONTROL

(71) Applicant: Rockwell Automation Technologies, Inc., Mayfield Heights, OH (US)

(72) Inventors: Michael S. Baran, Milwaukee, WI (US); Jason N. Shaw, Hubbard, OH (US); Gary D. Dotson, Muskego, WI (US); Bruce J. Moore, Lyndhurst, OH (US); Milan Svoboda, Pardubice (CZ); Pavel Jicha, Divcice (CZ); John C. Laur, Cudahy, WI (US); Keith O. Satula, New Berlin, WI (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 0 days.

(21) Appl. No.: 15/720,641

(22) Filed: Sep. 29, 2017

(65) Prior Publication Data

US 2018/0132382 A1 May 10, 2018

Related U.S. Application Data

(60) Provisional application No. 62/418,595, filed on Nov. 7, 2016.

(51) Int. Cl.
*H05K 7/20* (2006.01)
*F04D 25/06* (2006.01)
(Continued)

(52) U.S. Cl.
CPC ..... *H05K 7/20163* (2013.01); *F04D 25/0613* (2013.01); *F04D 25/166* (2013.01);
(Continued)

(58) Field of Classification Search
CPC ......... H01L 2924/0002; H01L 2924/00; H01L 23/467; H01L 23/427; G06F 1/20;
(Continued)

(56) References Cited

U.S. PATENT DOCUMENTS

| 5,642,260 A | 6/1997 | Sigl |
| 6,222,736 B1 * | 4/2001 | Sim .................. G06F 1/184 361/727 |
| 6,373,698 B1 * | 4/2002 | Christensen ......... G06F 1/20 174/16.1 |
| 6,556,437 B1 | 4/2003 | Hardin |
| 6,603,661 B2 | 8/2003 | Smith et al. |

(Continued)

FOREIGN PATENT DOCUMENTS

| CN | 2455044 Y | 10/2001 |
| CN | 2874091 Y | 2/2007 |

(Continued)

OTHER PUBLICATIONS

Extended European Search Report dated Aug. 28, 2018 for EP Application No. 17200384.0.

*Primary Examiner* — Adam B Dravininkas
(74) *Attorney, Agent, or Firm* — Fay Sharpe LLP

(57) ABSTRACT

An industrial automation controller includes a housing with a forced convection chamber. First and second fans are releasably connected to the housing and are adapted to induce airflow through the forced convection chamber. The first and second fans are each connected to the housing by respective first and second latch systems that each include a primary latch and a secondary latch. The secondary latch imposes a time delay during removal and replacement of a fan to facilitate hot swapping of the fan with a replacement fan. A make-last/break-first contact system is provided for each fan such that the fan is shutdown in a controlled manner prior to removal of the fan from the housing. The controller monitors internal temperature and fan speed. The controller initiates, logs, and reports fault conditions based upon the monitored temperature and/or fan speed. The controller is shut down if the monitored temperature exceeds a select temperature level.

20 Claims, 13 Drawing Sheets

(51) Int. Cl.
  *F04D 29/60* (2006.01)
  *H05K 1/02* (2006.01)
  *H05K 7/12* (2006.01)
  *F04D 25/16* (2006.01)
  *F04D 27/00* (2006.01)
  *H05K 7/14* (2006.01)

(52) U.S. Cl.
  CPC ......... *F04D 27/008* (2013.01); *F04D 29/601* (2013.01); *H05K 1/0203* (2013.01); *H05K 7/12* (2013.01); *H05K 7/1465* (2013.01); *H05K 7/20145* (2013.01); *H05K 7/20172* (2013.01); *H05K 7/20209* (2013.01); *H05K 7/20409* (2013.01)

(58) Field of Classification Search
  CPC .......... G06F 1/203; G06F 1/206; G06F 1/181; G06F 1/183; G06F 1/184; G06F 1/187; H05K 7/20172; H05K 7/20581; H05K 7/20727; H05K 7/20836; H05K 7/20736; H05K 7/20909; H05K 7/20145; H05K 7/20718; H05K 7/1432; H05K 7/20209; H05K 7/20745; F04D 29/601; F04D 25/08; F04D 25/0613; F04D 29/646; F04D 25/088; F04D 25/166; F04D 19/002; F04D 25/0693; F04D 27/004; F04D 25/06; F04D 19/007; F04D 29/4226; F04D 29/522; F04D 25/105; F04D 25/0606; F04D 27/008; F04D 29/626; F04D 29/668
  See application file for complete search history.

(56) References Cited

U.S. PATENT DOCUMENTS

| | | | |
|---|---|---|---|
| 7,675,747 | B1 | 3/2010 | Ong et al. |
| 2002/0152045 | A1* | 10/2002 | Dowling ............... B60Q 1/26 702/107 |
| 2003/0221291 | A1* | 12/2003 | Stewart ............. H05K 7/20172 16/422 |
| 2005/0105269 | A1* | 5/2005 | Chen ................. H05K 7/20172 361/695 |
| 2006/0279927 | A1* | 12/2006 | Strohm ................ F04D 29/023 361/695 |
| 2008/0304234 | A1* | 12/2008 | Franz ................ H05K 7/20172 361/695 |
| 2010/0232109 | A1 | 9/2010 | Liu |
| 2010/0247301 | A1* | 9/2010 | Hatozaki ............... H02M 7/003 415/182.1 |
| 2012/0305744 | A1 | 12/2012 | Chen et al. |
| 2013/0058781 | A1* | 3/2013 | Fu ..................... H05K 7/20581 415/220 |
| 2015/0208548 | A1* | 7/2015 | Chu .................. H05K 7/20172 361/695 |
| 2016/0053776 | A1* | 2/2016 | Williams ........... H05K 7/20136 361/695 |
| 2016/0292959 | A1* | 10/2016 | Salzman ............. G07F 17/3216 |

FOREIGN PATENT DOCUMENTS

| | | |
|---|---|---|
| CN | 200962706 Y | 10/2007 |
| CN | 201690345 U | 12/2010 |
| CN | 102809997 A | 12/2012 |
| CN | 204835934 U | 12/2015 |
| JP | 2008306138 A | 12/2008 |

\* cited by examiner

CONTROLLER WITH FAN MONITORING AND CONTROL

CROSS-REFERENCE TO RELATED APPLICATION

This application claims priority from and benefit of the filing date of U.S. provisional patent application Ser. No. 62/418,595 filed Nov. 7, 2016, and the entire disclosure of said provisional application is hereby expressly incorporated by reference into the present specification.

BACKGROUND

Certain industrial automation controllers and other electronics modules utilize a high-speed microprocessor (processor) and other electronic components that generate heat beyond that which can be dissipated sufficiently using natural convection airflow. In such cases, the controller must utilize a fan to flow forced air through the controller housing in which the processor is located to cool the processor.

Use of a fan to cool an industrial automation controller has drawbacks including fan reliability in that fan failure can lead to overheating and failure, throttling (slowing), or shut-down of the controller. As such, in a fan-cooled industrial automation controller or other electronic system, fan monitoring and control is essential to provide a warning of impending fan failure and to optimize fan operation in case one or more fans fail or begins to degrade in performance.

Known systems have not provided a suitable arrangement for removing a replacing a fan in a "hot-swapping" (Removal and Insertion Under Power (RIUP)) process in which the fan is removed and replaced without interrupting the operation of the industrial automation controller. Hot-swapping of a fan or other device presents challenges that must be addressed to prevent damage to the system in which devices are being removed and replaced to ensure continued operation of the system and long term reliability. In some cases, the system does not have sufficient time to prepare for removal of the device being removed and replaced which can lead to inability of the system to adjust for the removal of the device. This can lead to unexpected system responses which are highly undesirable.

An important goal is to maximize the product life of an industrial automation or other electronics controller module. As such, it is desirable to keep the temperature of the processor and/or other electronics parts of the controller as close as possible to an optimal temperature at which the processor is not thermally stressed. While this could be achieved by running a fan at full speed all the time, this would result in shorter fan life, increased power consumption and increased noise, so this is not an optimal solution.

As such, a need has been identified for an industrial automation controller system and method with fan monitoring and control to provide a warning of impending fan failure and to optimize fan operation in case one or more fans fail or begins to degrade in performance. A need has also been identified for such a system in which a fan can be removed and replaced in a hot-swapping operation that is tightly controlled to prevent undesired system responses. A need has also been found for a new and improved fan control solution achieves the required cooling while maximizing fan life, reducing power consumption and noise, and that facilitates repair and replacement of a fan when required without a shutdown of the controller module.

SUMMARY

In accordance with a first aspect of the present development, an industrial automation controller includes a housing that includes a forced convection chamber. A processor is located in the housing. A fan module is releasably connected to the housing and operatively associated with the forced convection chamber such that the fan module is adapted to induce airflow through the forced convection chamber. A latch system releasably connects the fan module to the housing. The latch system includes: (i) a primary latch that engages the fan module to the housing in an operative installed position of the fan module; and, (ii) a secondary latch that engages the fan module to the housing in an intermediate position of the fan module. The fan module is selectively movable from the operative installed position where the fan module is operatively located relative to the housing to the intermediate position only by disengagement of the primary latch. The fan module is movable from the intermediate position to an opened position where the fan module is manually separable from the housing only by disengagement of the secondary latch.

In accordance with another aspect of the present development, the industrial automation controller further includes a fan interface printed circuit board assembly connected to the housing and including a plurality of primary electrical contacts. The fan interface printed circuit board assembly is operably connected to the processor. A plurality of fan module contacts are connected to the fan module. The primary contacts respectively electrically mate with and engage the fan module contacts when the fan module is located in its operative installed position for electrically connecting the fan module to the fan interface printed circuit board. At least one of the primary contacts and its respective mating fan module contact is configured as a make-last/break-first contact pair such that upon movement of the fan module from its operative installed position to its intermediate position relative to the housing, the make-last/break-first contact pair is electrically disconnected while other fan module contacts remain electrically connected to their respective mating primary contacts such that disconnection of the make-last/break-first contact pair provides input to the processor that the fan module has been moved from its operative installed position to its intermediate position.

In accordance with a further aspect of the present development, an industrial automation controller includes a housing that includes a forced convection chamber. A processor is located in the housing. First and second fans are releasably connected to the housing and are operatively associated with the forced convection chamber such that the first and second fans are adapted to induce airflow through the forced convection chamber. The first and second fans are connected to the housing by respective first and second latch systems. Each of the first and second latch systems include: (i) a primary latch that engages the fan to the housing in an operative installed position of the fan; and, (ii) a secondary latch that engages the fan to the housing in an intermediate position of the fan. Each of the first and second fans is selectively movable from the operative installed position where the fan is operatively located relative to the housing to an intermediate position only by disengagement of its respective primary latch. Each of the first and second fans is movable from the intermediate position to an opened position where the fan is manually separable from the housing only by disengagement of its respective secondary latch.

According to another aspect of the present development, a method of operating an industrial automation controller includes monitoring a fan speed of at least first and second fans that induce a forced airflow through a chamber in a housing, and monitoring a temperature in the chamber of the housing. The method includes at least one of (i) initiating a minor fan speed fault if the speed of at least one of the first and second fans is below a select value; (ii) initiating a major temperature fault and shutting down the controller if the temperature in the chamber exceeds a select maximum value.

DETAILED DESCRIPTION

Figure 1:
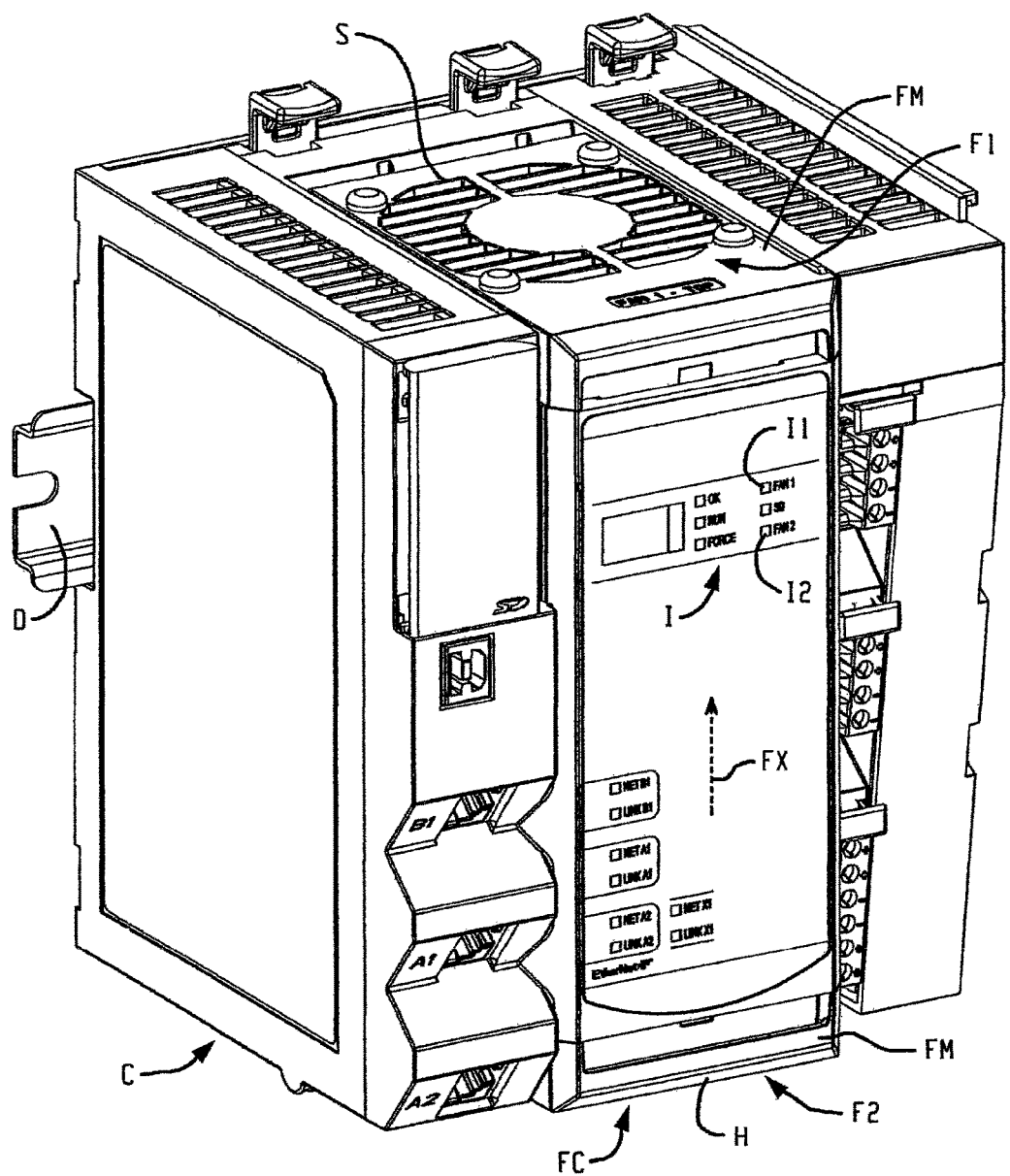
FIG. 1 shows an electronics module such as an industrial automation or other controller module according to an embodiment of the present development.
Figure 2:
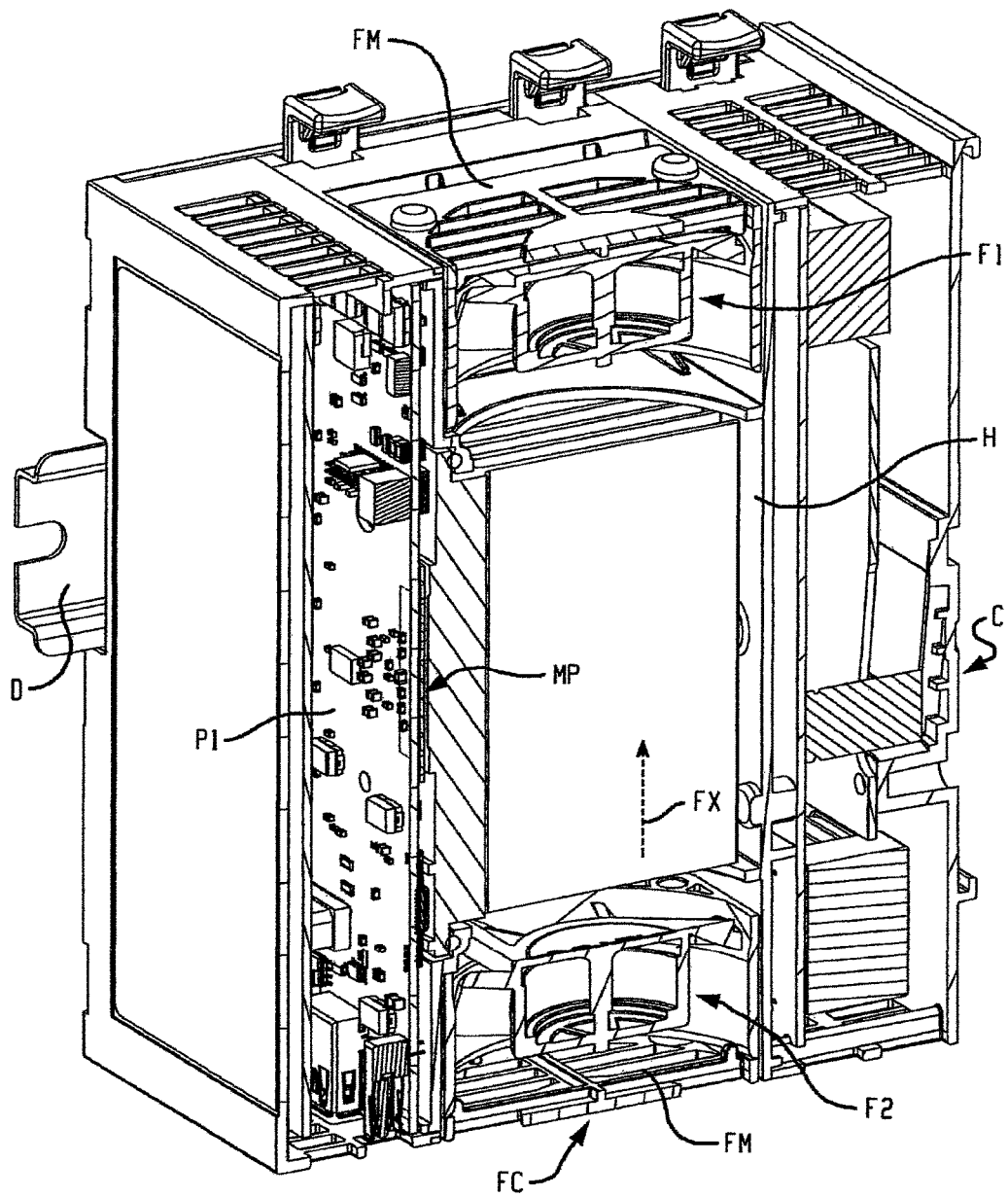
FIG. 2 is a section view of the controller module of FIG. 1.

FIGS. 1 and 2 show an electronics module C according to an embodiment of the present development connected to a DIN rail D. As shown herein, the electronics module C comprises an industrial automation controller ("controller") that includes at least one fan that induces airflow through a forced convection chamber FC defined in the housing H. In the illustrated embodiment, the controller C comprises a first or upper (exhaust) fan module or fan F1 and a second or lower (intake) fan module or fan F2 that induces airflow FX through the forced convection chamber FC and through slots S defined in the housing H to cool the electronic and other components inside the interior space of the controller housing H. The first and second fans F1,F2 can be identically physically structured but operated to move air through the housing H in the same direction with the first (upper) fan F1 operated to exhaust air and the second (lower fan F2) operated to input air, or the fans F1,F2 can alternatively have a different physical structure as compared to each other.

The controller C includes a main printed circuit board assembly (PCBA) P1 that includes a microprocessor MP and related electronic components for operating the controller C including the fans F1,F2 as described herein. More particularly, the fans F1, F2 are operated by the processor MP and other electronic circuitry of the printed circuit board assembly P1 to function as either an exhaust fan (preferably when the fan module FM is installed as the first/upper fan F1) or an intake fan (preferably when the fan module FM is installed as the second/lower fan F2) to induce forced air convection FX through the forced-convection chamber FC to cool the microprocessor and other components of the controller module C. The controller C housing H includes a face plate or other part with one or more indicators I (FIG. 1) such as LEDs or the like that provide an externally visual status to an operator concerning the operational state of each fan module FM. According to the present development, the fan module FM for either the first fan F1 or second fan F2 is able to be replaced in a hot-swappable manner, i.e., without interrupting the operation of the industrial controller C and the machines and/or processes being controlled thereby.

Figure 3:
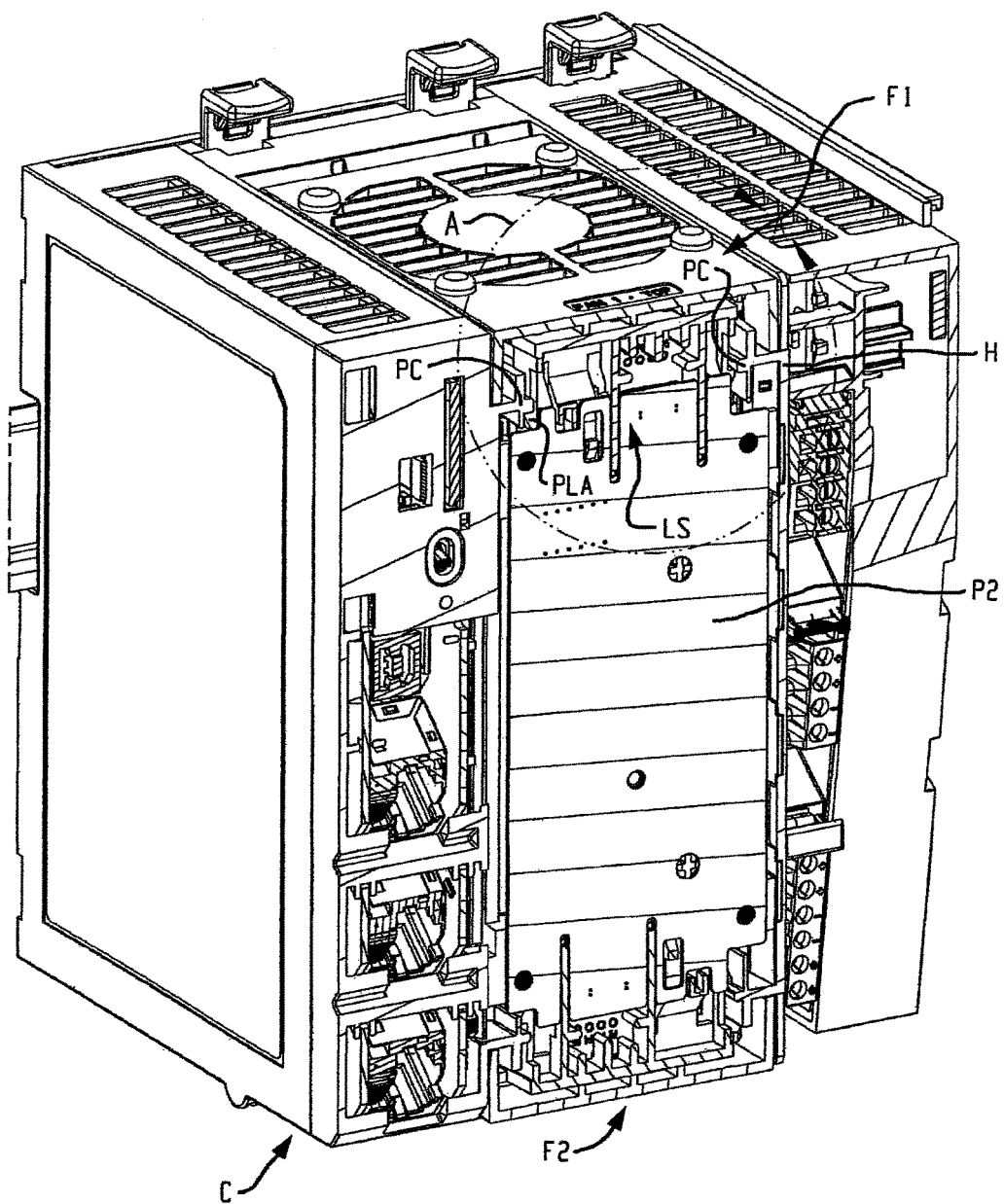
FIG. 3 shows the controller C with a face plate portion of the housing removed, and shows the fan modules located in their fully installed (engaged or closed), operative positions.
Figure 3A:
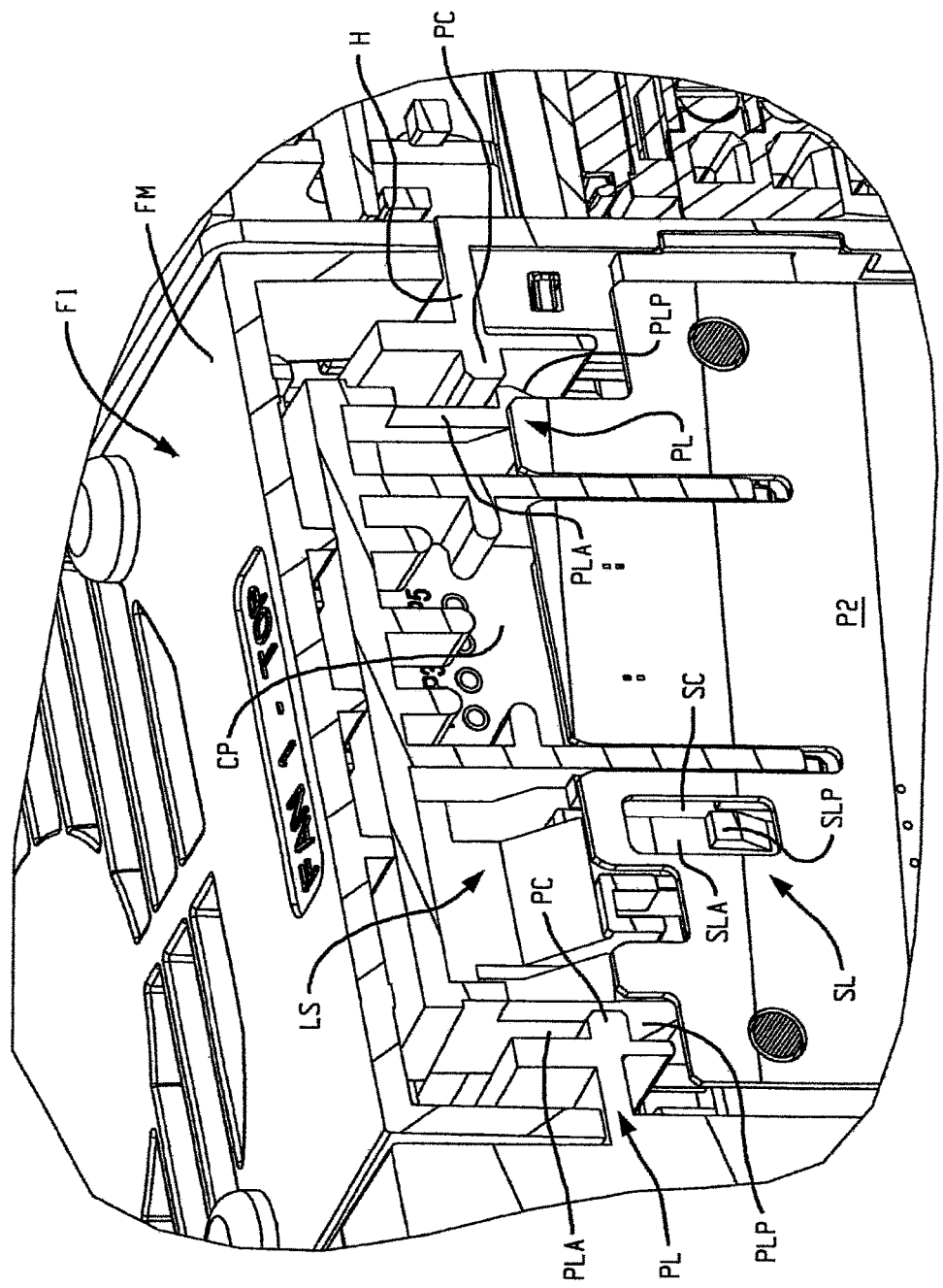
FIG. 3A is a greatly enlarged view of detail portion A of FIG. 3.

FIG. 3 shows the controller module or controller C with a front face plate portion of the housing H removed. The fan modules FM for both fans F1,F2 are located in the fully installed, operative position on the housing H. FIG. 3A is a greatly enlarged detail view of portion A of FIG. 9.

Figure 4:
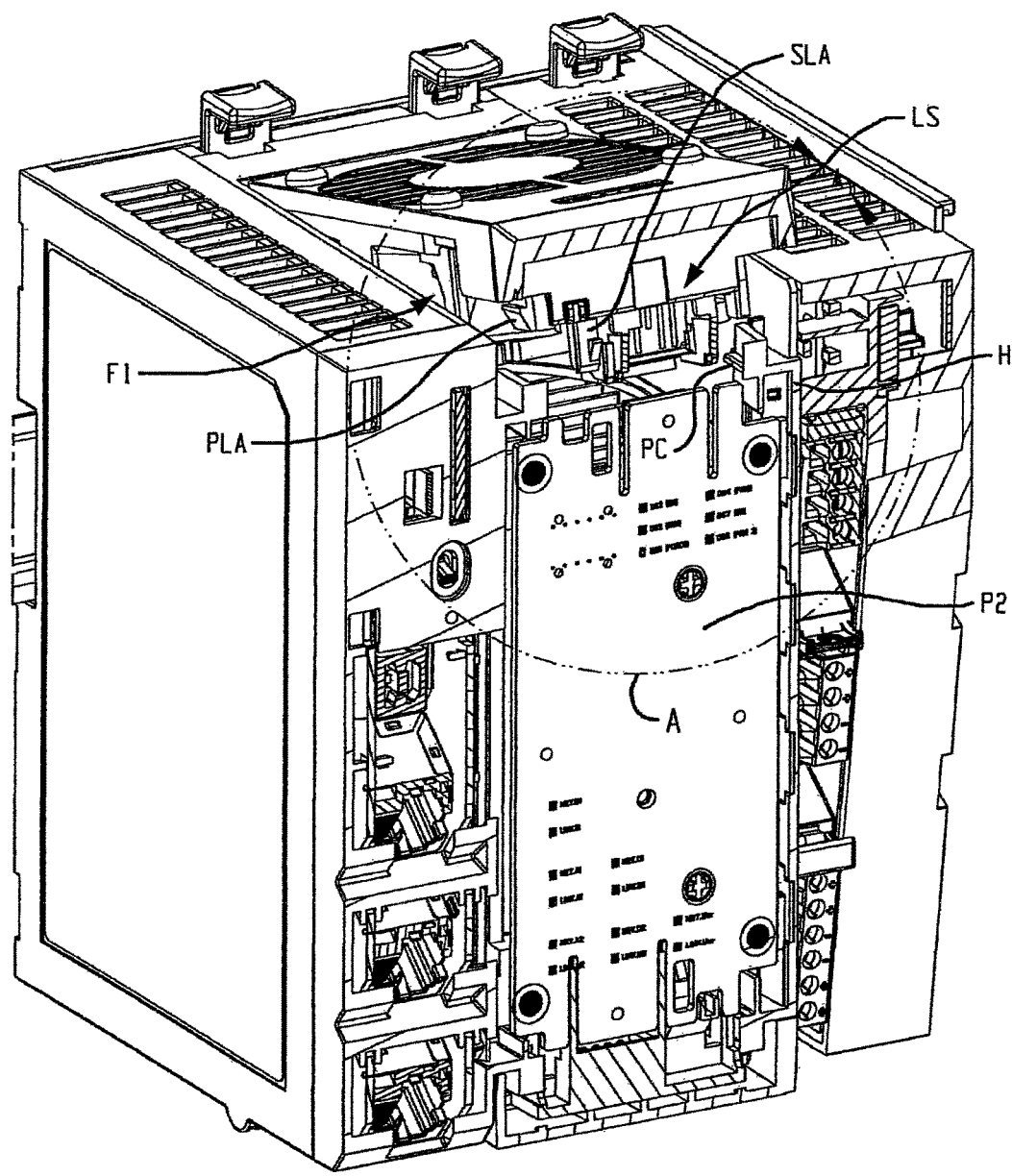
FIG. 4 is similar to FIG. 3 but shows the upper fan module located in its opened or disengaged position for physical removal of the fan module from the controller housing or installation of the fan module to the controller housing.
Figure 4A:
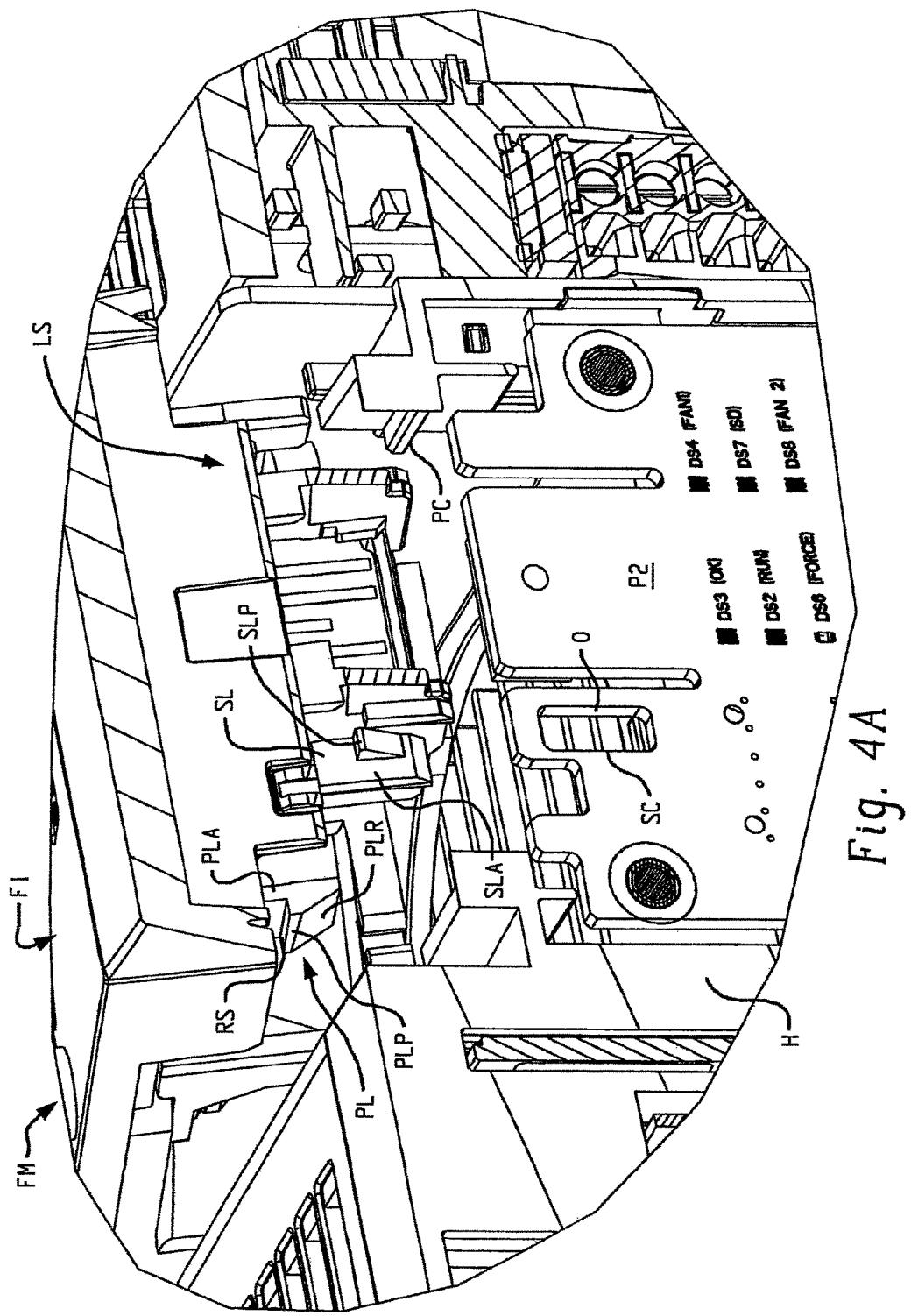
FIG. 4A is a greatly enlarged view of detail portion A of FIG. 4.

FIG. 4 corresponds to FIG. 3, but shows the first fan module F1 in a disengaged (or opened) position relative to the housing H, a position in which the fan module F1 can be physically separated from the housing H, and the same position for installation of the fan module F1 to the housing H. FIG. 4A is a greatly enlarged detail view of portion A of FIG. 4. In both FIGS. 3 and 4, it can be seen that the controller C comprises a fan interface printed circuit board assembly P2 that is connected to the forced convection housing or housing portion H. The fan interface printed circuit board assembly P2 includes electronic circuits and other electronic components that operably connect the fan modules FM (F1,F2) to the main printed circuit board assembly P1 of the controller C such that the fan modules FM are controllable by the processor MP in terms of turning the fans F1,F2 "on," turning the fans "off," speed of the fans, direction of the fans, and for monitoring the state and performance of the fans F1,F2 by the controller processor MP as described in detail below.

Each fan module FM is releasably connected to the controller housing H such that the fan module FM can be selectively removed or disconnected from the housing H for replacement. In particular, each fan module FM is pivotally or otherwise selectively movable relative to the housing portion H between a fully installed, operative (or closed) position as shown in FIGS. 3 and 3A, and a disengaged (or opened) position shown in FIGS. 4 and 4A. When the fan module FM is located in its closed, operative position (FIG. 3) it is physically captured to the housing H and cannot be separated from the housing H without purposeful manual effort by a user as described below. When the fan module FM is pivoted to its disengaged/opened position as shown in FIGS. 4 and 4A the fan module FM is disengaged from the housing H and can be physically separated from the housing H for replacement. Conversely, installation of the fan module FM requires engaging the fan module with the housing H beginning with the opened position (FIG. 4) and subsequent movement of the fan module FM to its closed/engaged position (FIG. 3). The present development is described herein with reference to the first/upper fan module F1 as shown in FIGS. 3-6A, but the description applies equally to the second/lower fan module F2.

Figure 5:
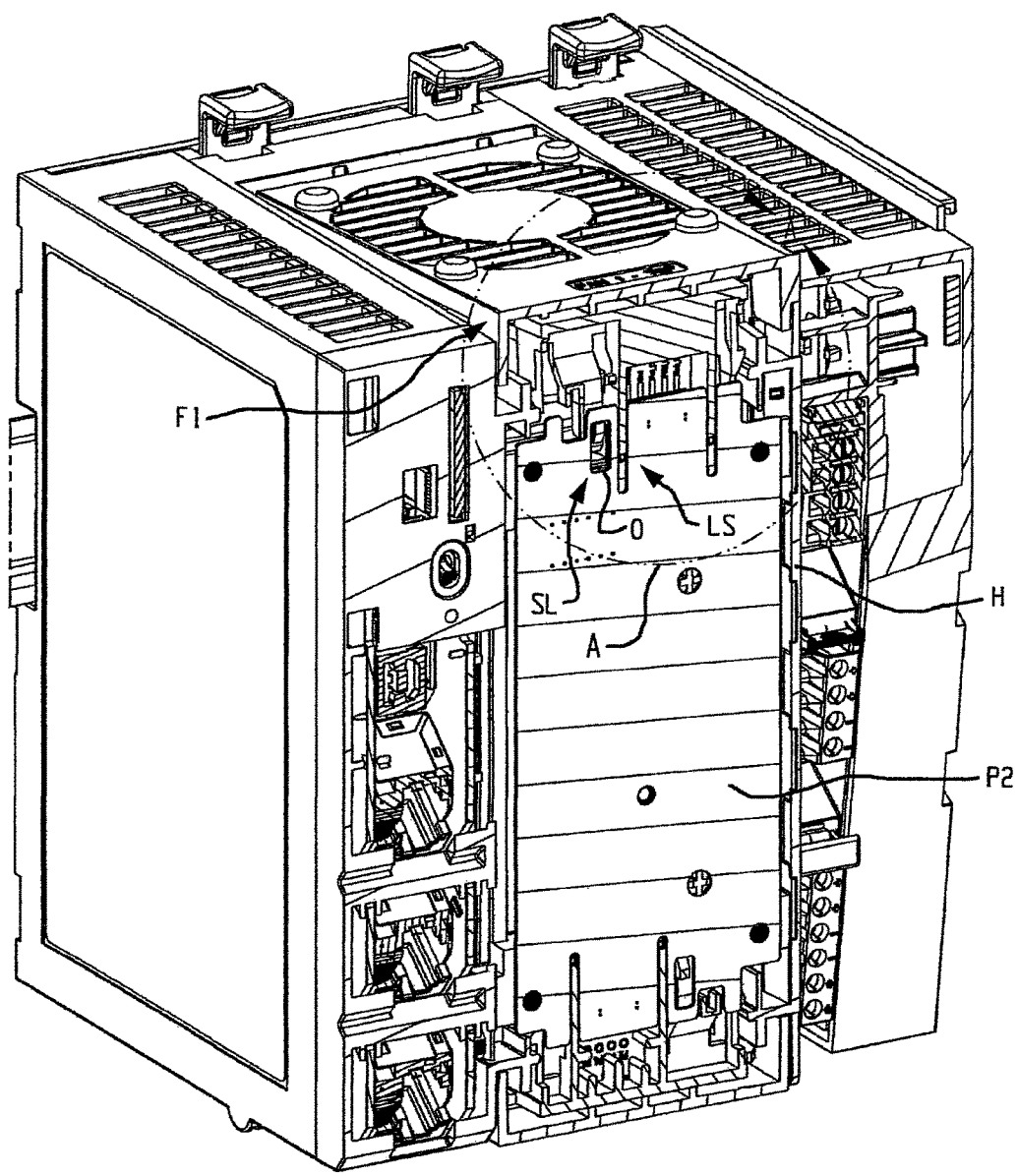
FIG. 5 also corresponds to FIG. 3, but shows the upper fan module in its intermediate position relative to the housing as provided by a secondary latch according to the present development.
Figure 5A:
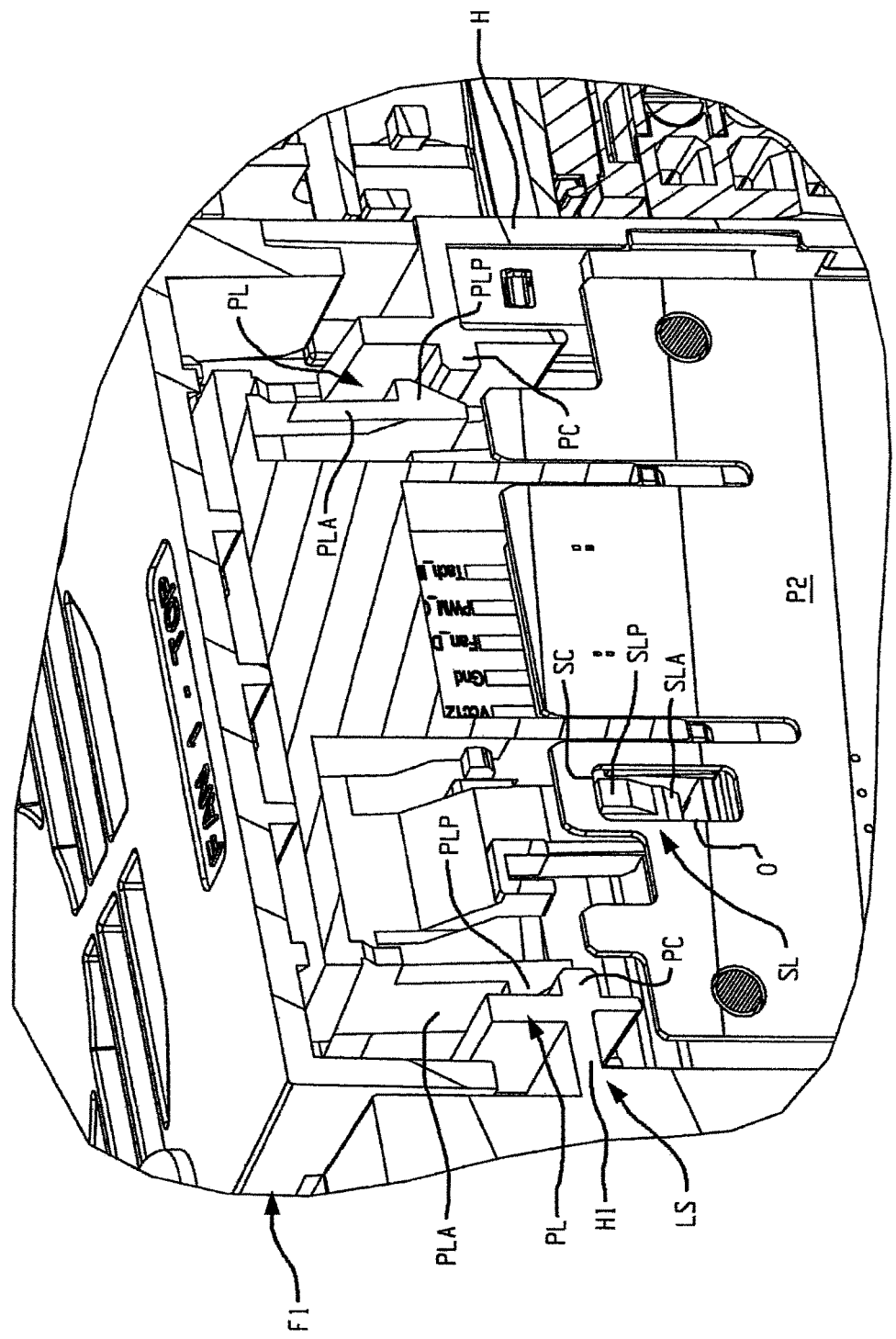
FIG. 5A is a greatly enlarged detail view of portion A of FIG. 5.

To facilitate hot-swapping of the fan module F1 as described above, the controller C comprises a dual-stage or two-stage latch system or mechanism LS including a primary latch PL and a secondary latch SL (see FIGS. 3A, 4A). The primary latch PL engages the fan module F1 to the housing H in the closed position, while the secondary latch SL engages the fan module F1 to the housing in an intermediate position located between the closed position (FIG. 3) and the opened position (FIG. 4). The intermediate position of the fan module F1 is shown in FIG. 5, which corresponds to FIG. 4, but shows the fan module F1 in its intermediate position relative to the housing H as provided by the secondary latch SL. FIG. 5A is a greatly enlarged detail view of portion A of FIG. 5.

Figure 6:
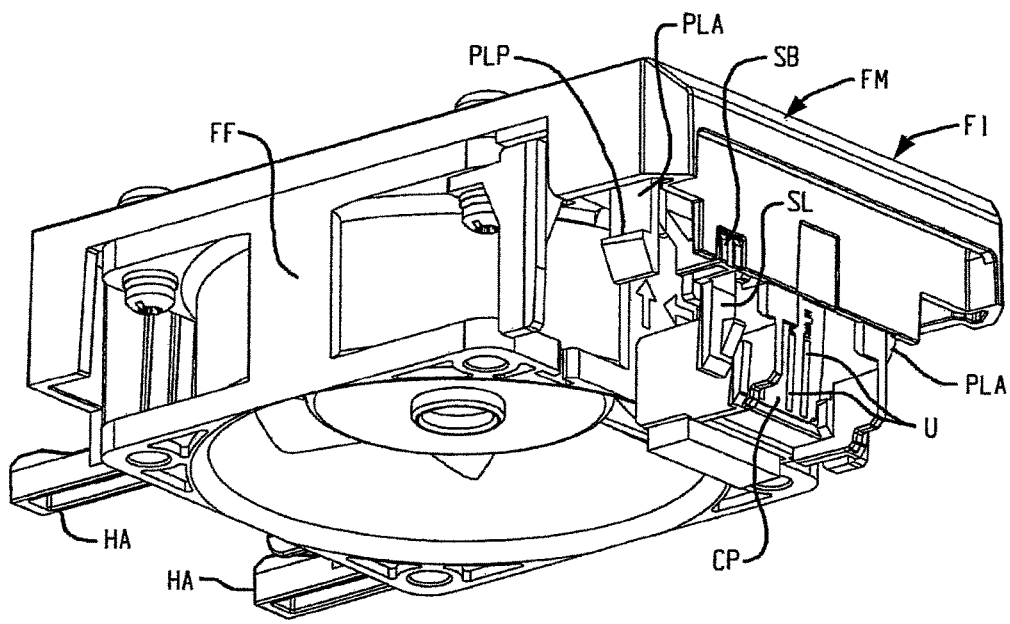
FIG. 6 is an isometric view that shows a fan module according to the present development by itself.
Figure 6A:
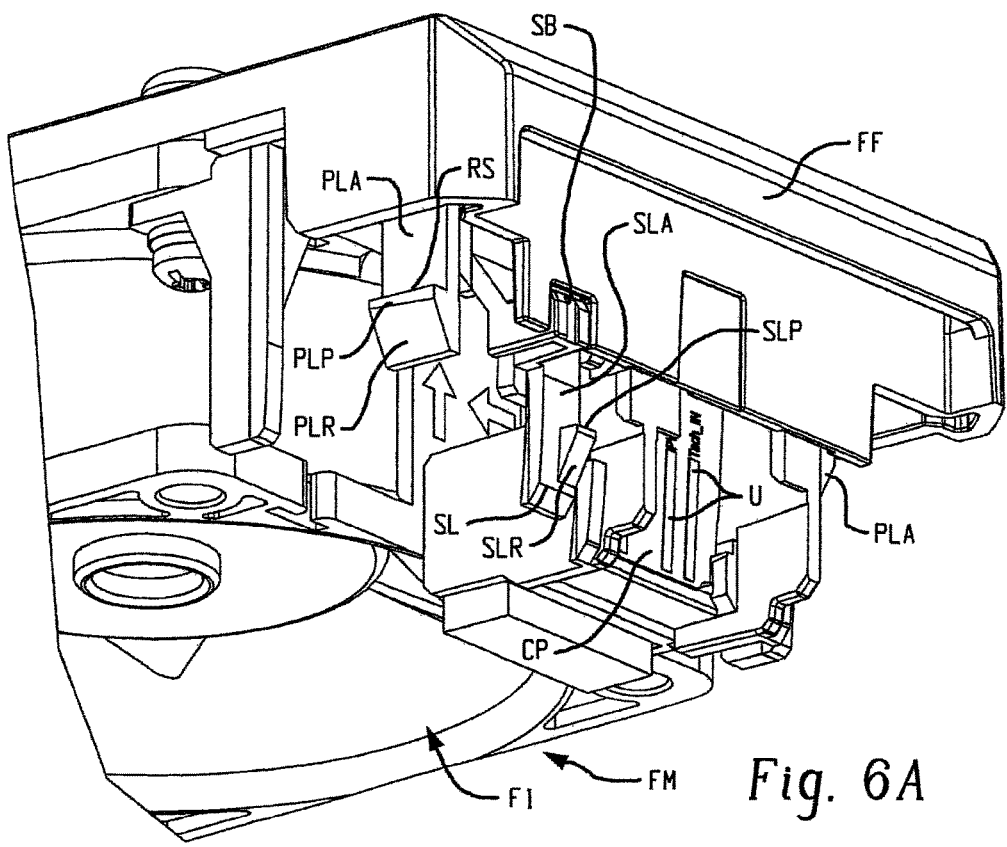
FIG. 6A is a partial, enlarged view of the fan module of FIG. 6.

FIG. 6 shows a fan module FM (F1) by itself, and FIG. 6A provides a partial, enlarged view of the fan module of FIG. 6. The fan module F1 comprises a molded polymeric or other frame FF. The fan module F1 includes one or more hinge arms HA or other mounting structure(s) for being selectively mated with the controller housing H to allow pivoting or other movement of the fan module F1 to and between its closed and opened positions by way of the intermediate position. In the illustrated embodiment, the primary latch PL comprises at least one primary latch arm PLA (the illustrated embodiment includes two spaced-apart primary patch arms PLA) connected to the fan module FM, and the primary latch PL further comprises at least one flange, lip, or other primary catch PC defined by or otherwise provided by or connected to the housing H, wherein each primary latch arm PLA is associated with a respective corresponding primary catch PC of the housing H to be selectively engaged therewith. The hinge arms HA and the primary latch arm(s) PLA are provided as part of the fan module frame FF, preferably as a one-piece molded polymeric structure or other one-piece construction.

To engage a respective primary catch, each primary latch arm PLA comprises a tooth or other primary latch projection PLP that projects outwardly from and outer end thereof. Each primary latch arm PLA is selectively resiliently deflectable or otherwise movable such that when the fan module F1 is moved toward and into the closed position (FIG. 3) from the intermediate position (FIG. 5) or opened position (FIG. 4), the primary latch projection PLP engages the primary catch PC of the housing H such that the primary latch arm PLA is first deflected relative to the primary catch PC to allow the primary latch projection PLP to move past the primary catch PC, and the primary latch arm PLA then resiliently returns toward or entirely to its undeflected or free position so that the primary latch projection PLP engages the primary catch PC to provide an engaged position for the primary latch PL when the fan module FM moves into its closed, operative position as shown in FIG. 3A. In the illustrated embodiment, the primary latch projections PLP include a ramp PLR (FIG. 4A) or are otherwise tapered as shown such that the primary latch arms PLA deflect in response to engagement with the housing H during movement of the fan module F1 from its opened position to its closed position to allow each primary latch PL to automatically engage a respective primary catch PC.

Similarly, the primary latch arms PLA are also selectively resilient deflectable or otherwise movable to disengage their respective latch projections PLP from the primary catch PC of the housing H to disengage the primary latch PL (the disengaged position of the primary latch PL) as shown in FIGS. 4A and 5A. In one embodiment, the primary latch arms PL are selectively deflectable to disengage the primary catch PC by a tool, linkage, or other direct or indirect engagement, or by manual urging of the fan module FM from its closed position toward its opened position to overcome the latching force of the primary latch arms PLA such that each primary latch arm PLA deflects sufficiently to move its locking projection PLP out of engagement with the respective primary catch PC in response to such opening force exerted on the fan module F1. The primary locking projection PLP and/or the primary catch PC is optionally shaped and dimensioned with a ramp or other tapered release surface RS (FIGS. 4A & 6A) to facilitate this deflection of the primary latch arm PLA out of engagement with the respective primary catch PC upon sufficient opening force being exerted on the fan module FM to move the fan module from its closed position toward its opened position.

As shown herein, the secondary latch SL comprises at least one secondary latch arm SLA connected to the frame FF of the fan module FM (F1). The secondary latch arm(s) SLA is also preferably molded as a one-piece construction with the fan module frame FF. The secondary latch arm SLA is resiliently deflectable and includes a tooth or other secondary latch projection SLP for selectively engaging a secondary catch SC provided by the housing H or provided another structure that is affixed to the housing H such as the fan printed circuit board assembly P2 as shown in the present embodiment. FIGS. 3A, 4A, and 5A show that the fan printed circuit board assembly P2 includes a secondary catch SC comprising a recess or opening O or other structure in which the secondary latch projection SLP is received to provide an engaged position of the secondary latch SL when the fan module FM is located in its closed position (FIG. 3A) and in its intermediate position (FIG. 5A). The secondary catch opening O is elongated or the secondary catch SC is otherwise conformed and dimensioned to allow movement of the secondary latch projection SLP therein or relative thereto as the fan module FM pivots between its closed position and the intermediate position. However, the engagement of the secondary latch projection SLP with the secondary catch SC prevents or blocks movement of the fan module FM from the intermediate position (FIG. 5A) toward or to the opened position (FIG. 4A) because the secondary latch projection SLP abuts an edge of the opening O of the secondary catch SC or is otherwise blocked by the secondary catch SC. In the illustrated embodiment, the secondary latch projection SLP abuts the printed circuit board assembly P2 at the periphery of the opening of the secondary catch SC to block movement of the fan module F1 from the intermediate position to the opened position.

In order to move the fan module F1 to the opened position (FIG. 4A) from the intermediate position (FIG. 5A) the secondary latch arm SLA is selectively deflectable to disengage its secondary lock projection SLP from the secondary catch SC by a tool, or by direct or indirect manual movement (e.g., by way of a button, projection, linkage, etc.). As shown herein, the fan module F1 includes a secondary latch disengagement feature or button SB (see FIG. 6A) that is depressed by a tool or manually to deflect the secondary latch arm SLA as required to disengage the secondary latch projection SLP from the opening O or other part of the secondary catch SC such that the fan module F1 can be manually pivoted from the intermediate position to the opened position for its removal and replacement. The secondary latch projection SLP includes a ramp SLR (FIG. 6A) or is otherwise tapered as shown such that the secondary latch arm SLA deflects in response to engagement with the fan printed circuit board assembly P2 or other part of the secondary catch SC during movement of the fan module FM from its opened position toward its closed position to deflect the secondary latch arm SLA away from the secondary catch and allow the secondary latch projection SLP to move past the secondary catch SC, after which the secondary latch arm SLA resiliently returns toward or fully into its normal or free (undeflected) state so that the secondary latch projection is automatically engaged with the secondary catch SC.

Those of ordinary skill in the art will recognize that the required use of both a primary latch PL and a secondary latch SL during removal of the fan module F1 (or fan module F2) will result in an imposed time delay in moving the fan module F1 from its installed/closed position to its opened position because both the primary latch PL and secondary latch SL must be overcome in sequence to remove and replace a fan module F1. This imposed time delay advantageously allows time for the fan module F1 to be safely and controllably powered down by the processor MP of the controller C and, optionally, for the processor MP of the controller C to compensate for removal of the fan module being replaced by increasing the speed of the remaining fan module F2 to prevent or at least minimize the reduction in airflow through the forced convection chamber FC during the time when only one fan module FM is present.

Figure 7:
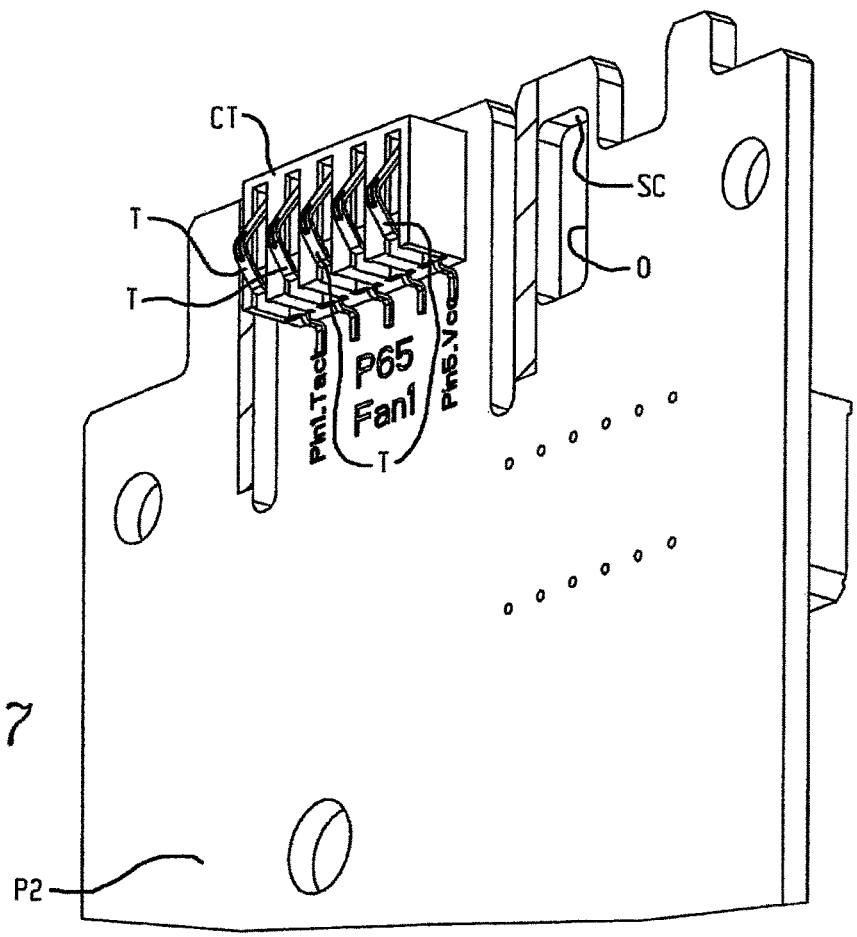
FIG. 7 provides a partial isometric view of a fan printed circuit board portion of the controller module including a fan control connector according to one embodiment of the present development.
Figure 8:
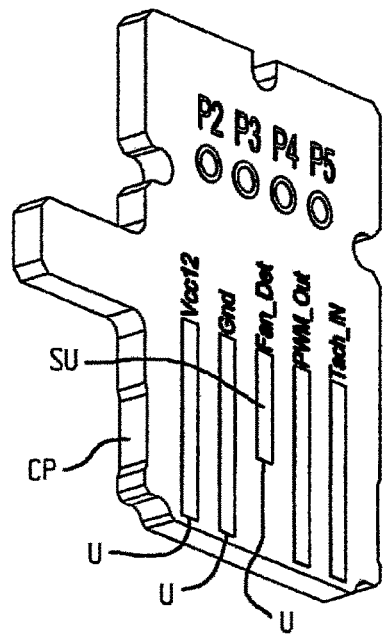
FIG. 8 is an isometric view of a contact printed circuit board portion of the fan module of FIG. 6 that selectively mates with the connector of FIG. 7.

As shown in FIG. 7, the fan printed circuit board assembly P2 includes a plurality of primary contacts T connected thereto as part of a connector CT or otherwise. The fan module F1 includes corresponding mating fan module contacts U such as those provided on a contact printed circuit board CP (FIG. 6A) installed on the fan module FM (the contact printed circuit board CP is also shown separately in FIG. 8). The fan module contacts U are configured to engage respective primary contacts T of the fan printed circuit board assembly P2 when the fan module FM is operatively installed in its operative position. One of the fan module contacts U and its respective mating primary contact T are configured as a make-last/break-first contact pair, wherein the fan module contact of the make-last/break-first contact pair is configured as a signal contact SU that is shorter in length or otherwise configured differently from the other fan module contacts U (alternatively, one of the primary contact T is configured as the signal contact SU of the make-last/break-first contact pair. During movement of the fan module FM from its installed, operative position (FIG. 3A) toward and into the intermediate position (FIG. 5A), the signal contact SU will disconnect from its primary respective contact T of the fan printed circuit board assembly P2 while other fan module contacts U remain engaged with their respective contacts T of the fan printed circuit board assembly P2 when the fan module FM is located in the intermediate position. As such, the breaking/opening or change of state of the signal contact SU provides an indication to the processor MP that the fan module FM has moved to its intermediate position, but the processor MP can still monitor and control the fan module through the remaining mated contacts U,T.

Figure 9:
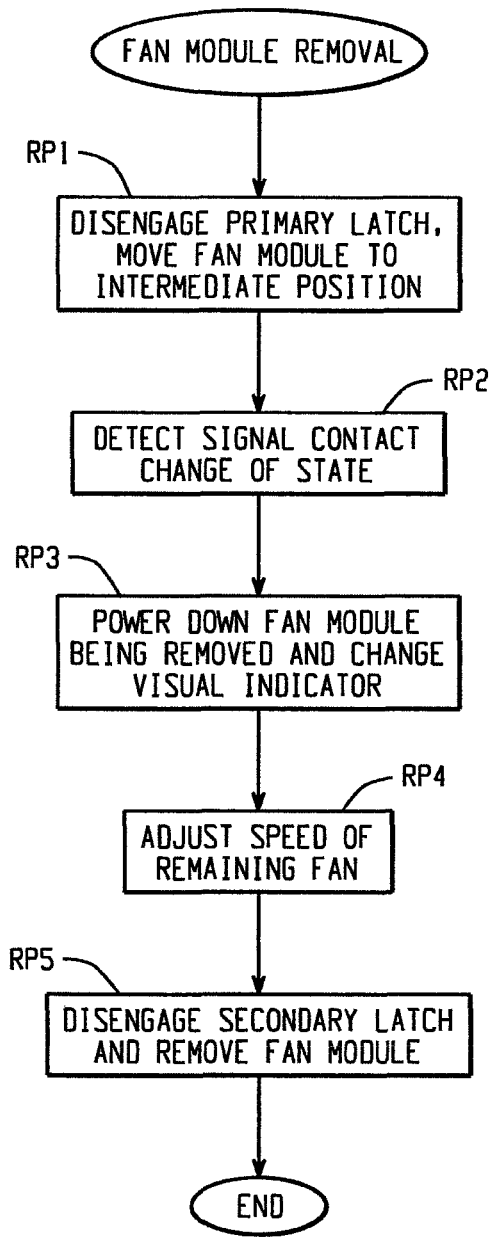
FIG. 9 is a flow chart that illustrates a fan module removal process according to one embodiment of the present development.

Referring now also to FIG. 9, during a fan module removal process, the fan module FM is moved to its intermediate position (FIGS. 5 & 5A) after the primary latches PL are disengaged during a hot-swapping procedure for the fan module FM (Step RP1). Movement of the fan module FM to its intermediate position causes an open condition or change of state for the related signal contact SU when the signal contact SU of the fan module circuit board CP separates from its corresponding mating primary contact T of the fan printed circuit board P2 to indicate to the processor MP that the fan module FM has moved from its operative position to its intermediate position, indicating that a fan module removal/replacement operation is occurring (Step RP2). When the fan module FM is in its intermediate state, a required number of the contacts U of the fan module circuit board CP other than the signal contact SU remain electrically engaged with their respective primary contacts T of the fan printed circuit board assembly P2 so that the fan module FM will continue to operate to provide forced airflow FX as controlled by the processor MP or another processor of the controller C, but the open signal contact SU will indicate to the processor MP that the fan module FM should be powered down to an inoperative state, and that the state of the related visual indicator I (FIG. 1) should be changed to indicate that the fan module FM has been removed (Step RP3). In one embodiment, the make-last/break-first contact pair including the signal contact SU is operatively connected to the gate of a power supply switch such as a power field-effect transistor (FET) that supplies operating voltage to the fan module FM such that when the signal contact SU disengages from its respective mating primary contact T, the FET or other power supply switch disconnects the fan module FM from its voltage source to power down or turn off the fan module FM without requiring any action by the processor MP. Optionally, in a step RP4, the speed of the other remaining operative fan module FM is increased to compensate for the loss of airflow of the fan module FM being removed. In a step RP5, the secondary latch DL is disengaged and the fan module FM is moved to its opened/disengaged position and removed from the housing H. The delay caused by the need for the secondary latch SL to first be disengaged in order to move the fan module FM from its intermediate position (FIG. 5A) to its opened disengaged position (FIG. 4A) will allow sufficient time for the processor MP to power down the fan module FM being removed and to otherwise adjust for its removal using the fan module contacts U that are still connected with their respective contacts CT of the fan printed circuit board assembly P2. When the secondary latch SL is disengaged and the fan module FM is moved to its opened position, all of the fan module contacts U will be separated from their respective primary contacts T of the fan printed circuit board assembly P2 such that the fan module FM will be electrically isolated from the fan printed circuit board assembly P2 and the main printed circuit board assembly P1 for safe removal and replacement of the fan module FM when the fan module FM is in an inoperative state. During replacement of the fan module FM, the process is reversed, and the processor MP detects when the fan module FM is first located in its intermediate position, and detects when the fan module FM is ultimately moved to its fully installed operative position based upon whether or not the signal contact SU is electrically connected to its respective contact T of the fan printed circuit board assembly P2. If both (all) fan modules FM are removed, or if one fan module FM is failed and the other is then removed, the processor MP will perform a controlled shutdown of the controller C to prevent overheating.

Those of ordinary skill in the art will recognize that the above development provides an arrangement of features in a removable fan module such that a time delay is imposed upon the removal of the fan module FM from the controller housing H so that the processor MP will have sufficient time to react by removing power and for performing other housekeeping functions before the fan module FM is completely separated from the controller housing H. Each fan module FM comprises a two-stage latch system LS including a primary latch PL whose function is keep the fan module FM located in its fully assembled/closed/installed position for normal operation. An initial step in removing the fan module FM from the housing H is releasing the primary latch PL and beginning the necessary pivoting or other movement of the fan module FM toward its opened position. The fan module FM also includes a secondary latch SL which stops the fan module FM at a pre-defined intermediate location, and the secondary latch SL then requires an additional action by the user to release the secondary latch SL to allow the fan module FM to be moved to its fully released/opened/disengaged position where the fan module FM can then be removed from the housing H.

As noted above, the fan modules FM of both the first and second fans F1,F2 are controlled by the processor MP or other electronic processor of the controller C to provide forced air convection FX through the housing H as described above. The controller housing H includes a face plate or other part with one or more indicators I (FIG. 1) such as LEDs or the like that provide an externally visual status to an operator concerning the operational state of each fan module FM. As shown in the present example, a first indicator I1 is provided for the first fan F1 and a second indicator I2 is provided for the second fan F2, and the indicators are labeled as such.

Using the signal contact SU as described above, the controller processor MP automatically determines the presence of one or more fan modules FM as part of the controller C, and the processor MP also automatically determines the number of fan modules FM included in the controller C and controls the or each fan module accordingly as described below.

The processor MP monitors the operational status of each fan module FM and controls the respective indicator I to provide a visual indication of the fan module status to an operator of the controller C. In the present example, a first color (e.g., green) is used to indicate proper fan operation, a second color (e.g., red) is used to indicate fan failure or removal, and a third color (e.g. amber) or intermittent illumination (e.g., flashing green or red) is used to indicate a warning that fan performance has degraded from the preferred level or range. The visual indicators I provide a convenient method for a maintenance person or other user to determine if and why a fault has been indicated. The processor MP implements other minor and major faults that are issued, logged, and reported as described herein. Since the controller C is typically enclosed inside a cabinet and not visible under normal conditions, the controller C preferably implements a fault reporting and logging system to alert users and maintenance personnel that a fault has occurred and to provide information as to the cause of the fault. The reporting and logging of faults and alarms is carried out using a network communication port of the controller C to communicate the fault and alarm to other monitoring or control means that can in turn actively alert the user as soon as and by whatever means they choose (email, pager, text message, stack light, etc.).

Figure 10:
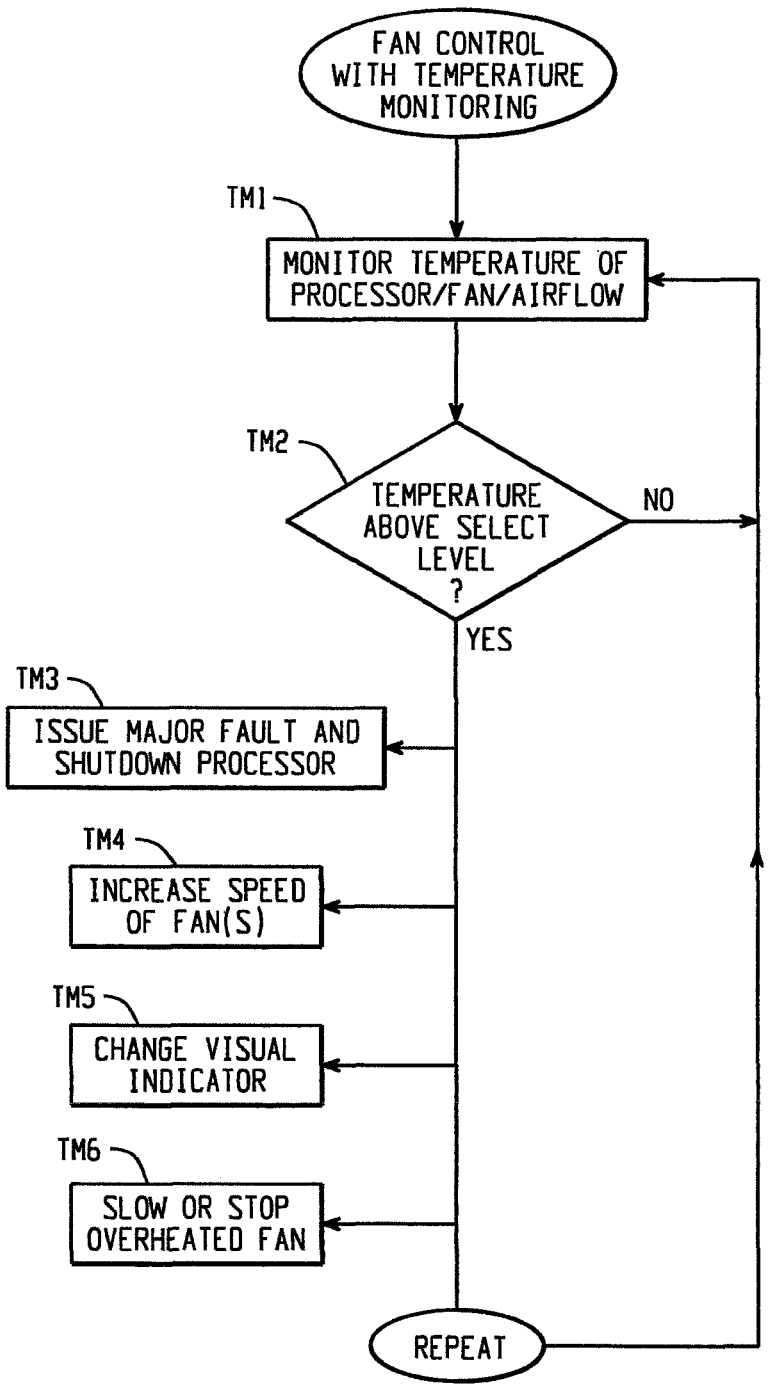
FIG. 10 is a flow chart that illustrates a fan control method with temperature monitoring according to an embodiment of the present development.

The controller C includes multiple temperature sensors including on the processor MP, on the fan printed circuit board P2, and elsewhere in the controller C. The processor MP implements a temperature based fan control method as shown in FIG. 10. In a temperature monitoring step TM1, the processor MP monitors its own core temperature and/or the temperature of other components of the controller C and/or of the air flowing through the controller housing H. In a step TM2, processor MP determines if the temperature exceeds a select level or value and, if so, the processor MP takes corrective or remedial action (steps TM3-TM6) to cool and prevent damage to the controller C.

In one example, the processor MP also monitors its own core temperature in steps TM1,TM2 and, if the core temperature of the processor MP exceeds a select level, the processor MP will perform a step TM3 to issue a major fault which is reported and logged, and then the processor MP will perform a controlled shutdown.

If the temperature determined by step TM2 is higher than desired but still below the select level, the processor MP can perform the step TM4 to increase the speed of one or more fan modules FM to increase forced convection cooling FX. A return of the monitored temperature(s) to the desired value or range as indicated by the step TM2 will cause the processor MP to reduce the speed of the fan module FM for which the speed was increased.

It should be noted that product mean time between maintenance (MTBM) for the controller C is a compromise between temperature inside the controller C and the bearing life of each fan module FM. In the step TM2, the select temperature level used is preferably less than the absolute limit of the processor MP so that the temperature of the processor MP will be maintained at less than its absolute maximum limit for increased life. This allows the controller MP to last longer and allows the fan modules FM to operate at less than maximum (100%) speed so that the bearings of the fan modules have increased life.

In another embodiment, via steps TM1 and TM2, the processor MP directly monitors the temperature of each fan module FM, itself, and compares the fan temperature with a select temperature limit or range. Fan temperature above the select limit or range will cause the processor MP to implement a step TM5 to control the relevant visual indicator I to provide a warning of decreased fan performance (e.g., a flashing indicator I) or fan failure (e.g., a red indicator I). The processor MP can also either slow or stop the fan module FM with excessive temperature (step TM6) and/or can increase the RPM speed of the other fan (step TM4) to provide cooling to the overheated fan module FM.

Figure 11:
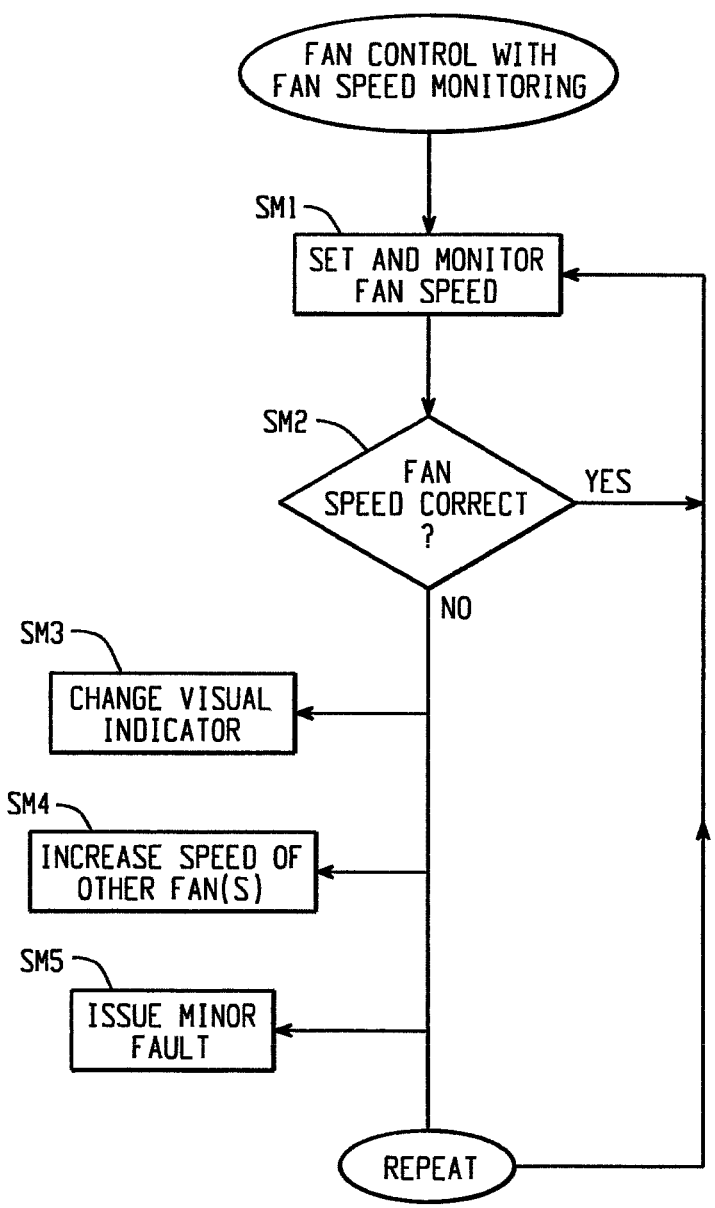
FIG. 11 is a flow chart that illustrates a fan control method with fan speed monitoring according to an embodiment of the present development.

As also shown in FIG. 11, in a step SM1 the processor MP controls each fan module FM to run at a select set speed (RPM), and the processor MP also receives feedback and monitors the actual speed of the fan being controlled. In a step SM2, the processor MP determines if the speed of each fan module FM is correct, meaning that the actual measured speed of the fan module is compared with the fan speed set by the processor MP. In step SM2, the processor MP determines if the fan speed is below a select minimum level and/or a deviation between the fan set speed and the actual fan speed indicates that the fan is beginning to fail or has failed (e.g., the motor has burned out, the fan is jammed, etc. if the fan speed is zero) in which case the processor MP will take corrective or remedial action such as steps SM3-SM5.

In one example, the processor MP performs the step SM3 to control the related fan indicator I accordingly depending upon the severity in the mismatch between the set fan speed and the actual fan speed. If the variation between the set fan speed and the actual fan speed for a fan module FM is within a select tolerance range, the indicator I will be controlled by the processor MP to provide a minor fan speed fault condition warning of decreased fan performance (e.g., a flashing indicator I) for that fan module FM. If the variation between the set fan speed and the actual fan speed for a fan module FM is outside of the select tolerance range (greater than allowed by the tolerance range), or if a fan module has completely stopped, the relevant indicator I will be controlled by the processor MP to indicate a failed fan module (e.g., a red indicator I) and the fan module will be powered down (stopped) and the processor will initiate a major fan speed fault condition.

As shown at step SM4, in the case where the steps SM1,SM2 determine that one of the fan modules FM fails or degrades in terms of speed performance, the processor MP will preferably perform a step SM4 to control the other (good) fan module FM accordingly to compensate for the failed or degraded fan module FM, e.g., by increasing RPM speed of the properly operating fan module FM to increase cooling airflow FX. In such case, the processor will issue and log a minor fault as shown at SM5 but the controller C will continue to run, because the controller C is designed to operate using only a single fan module FM (air flow provided by two fan modules F1,F2 is double the required air flow). While bearing failure in a fan module FM can be a cause of a slow fan, a slow fan can also be caused by debris in the fan or airway that can be corrected with maintenance cleaning. In such case, the fan module FM will need to be cleaned but need not be replaced. Also, the fan modules FM are set to run always at least at a minimum speed to ensure that they don't get stuck from corrosion or debris.

If the step SM2 determines that both (all) fan modules FM have failed or are failing, the processor MP will continue to run provided that the temperature inside the controller C is below a select maximum temperature. If the temperature inside the controller C exceeds the select maximum temperature, the processor MP will perform a controlled shutdown of the controller C to prevent overheating. In general, the thermal load depends on the ambient temperature in the region of the controller C, and the controller C can continue operating provided that the select maximum temperature inside the controller C is not exceeded. It should be noted that if the temperature inside the controller C exceeds the select maximum temperature, the processor issues and logs a major fault and performs a controlled shutdown of the controller, regardless of the operational status of either fan F1,F2. Because the controller C will continue to run even if both fan modules F1,F2 are inoperative so long as the select maximum controller temperature is not exceeded, a maintenance person can replace one or both fan modules F1,F2 without fear that the controller C will shut down as soon as the fan modules F1,F2 are removed. It should also be noted that the processor MP can distinguish between a failed fan module F1,F2 and a removed fan module F1,F2.

The above-described speed control for the fan modules FM is preferably performed using a PI regulator. The proportional part of the regulator helps to react to temperature changes immediately, while the integral part of the regulator helps to compensate the change of ambient temperature, removed fan and other disturbances. The derivative part used in full PID regulator is not needed, because the temperature changes slowly and it would only increase response to noise in temperature readings.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. An industrial automation controller comprising:
a housing that includes a forced convection chamber;
a processor;
a fan module releasably connected to the housing and operatively associated with the forced convection chamber such that the fan module is adapted to induce airflow through the forced convection chamber;
a latch system that releasably connects the fan module to the housing, said latch system comprising: (i) a primary latch that engages the fan module to the housing in an operative installed position of the fan module; and, (ii) a secondary latch that engages the fan module to the housing in an intermediate position of the fan module;
wherein said fan module is selectively movable from said operative installed position where said fan module is operatively located relative to the housing to said intermediate position only by disengagement of the primary latch, and wherein said fan module is movable from said intermediate position to an opened position where said fan module is manually separable from the housing only by disengagement of the secondary latch;
said industrial automation controller further comprising:
a fan interface printed circuit board assembly connected to said housing and comprising a plurality of primary electrical contacts, said fan interface printed circuit board assembly operably connected to said processor;
a plurality of fan module contacts connected to said fan module;
wherein said primary contacts respectively electrically mate with and engage said fan module contacts when said fan module is located in its operative installed position for electrically connecting the fan module to the fan interface printed circuit board; and,
wherein at least one of the primary contacts and its respective mating fan module contact is configured as a make-last/break-first contact pair such that upon movement of said fan module from its operative installed position to its intermediate position relative to said housing, said make-last/break-first contact pair is electrically disconnected while other fan module contacts remain electrically connected to their respective mating primary contacts such that disconnection of said make-last/break-first contact pair provides input to said processor that said fan module has been moved from its operative installed position to its intermediate position.

2. The industrial automation controller as set forth in claim 1, wherein said fan module is disconnected from its operative voltage source when said make-last/break-first contact pair is disconnected and while said secondary latch is engaged and prevents movement of the fan module from said intermediate position to said opened position.

3. The industrial automation controller as set forth in claim 2, wherein said fan module contacts are provided on a contact printed circuit board connected to the fan module, and wherein said fan module contact of said make-last/break-first contact pair is a different length as compared to the other fan module contacts.

4. The industrial automation controller as set forth in claim 1, wherein said primary latch comprises a resilient primary latch arm connected to the fan module and a mating primary catch connected to the housing, wherein said primary latch arm engages said primary catch when said fan module is located in its operative installed position and said primary latch arm is selectively resiliently deflectable to disengage the primary latch arm from the primary catch.

5. The industrial automation controller as set forth in claim 4, wherein said secondary latch comprises a secondary latch arm connected to the fan module and a mating secondary catch connected to the housing, wherein said secondary latch arm engages said secondary catch when said fan module is located in its intermediate position and said secondary latch arm is selectively resiliently deflectable to disengage the secondary latch arm from the secondary catch.

6. The industrial automation controller as set forth in claim 1, wherein said processor monitors a speed at which said fan module operates and said processor initiates a minor fan speed fault condition if said speed is less than a select speed.

7. The industrial automation controller as set forth in claim 6, wherein said processor reports and logs said minor fan speed fault condition.

8. The industrial automation controller as set forth in claim 6, further comprising at least one visual indicator that changes state when said minor fan speed fault condition is initiated by said processor.

9. The industrial automation controller as set forth in claim 1, wherein said processor monitors a temperature within said housing and said processor changes a speed at which said fan module operates based upon said temperature.

10. The industrial automation controller as set forth in claim 9, wherein said processor initiates a major temperature fault condition and powers down the controller if said temperature exceeds a select level.

11. The industrial automation controller as set forth in claim 10, wherein said processor reports and logs said major temperature fault condition.

12. The industrial automation controller as set forth in claim 10, further comprising a visual indicator, wherein said processor that changes a state of the visual indicator when said major temperature fault condition is initiated by said processor.

13. An industrial automation controller comprising:
a housing that includes a forced convection chamber;
a processor;
a fan module releasably connected to the housing and operatively associated with the forced convection chamber such that the fan module is adapted to induce airflow through the forced convection chamber;
a latch system that releasably connects the fan module to the housing, said latch system comprising: (i) a primary latch that engages the fan module to the housing in an operative installed position of the fan module; and, (ii) a secondary latch that engages the fan module to the housing in an intermediate position of the fan module;
wherein said primary latch comprises a resilient primary latch arm connected to the fan module and a mating primary catch connected to the housing, wherein said primary latch arm engages said primary catch when said fan module is located in its operative installed position and said primary latch arm is selectively resiliently deflectable to disengage the primary latch arm from the primary catch;
wherein said secondary latch comprises a secondary latch arm connected to the fan module and a mating secondary catch connected to the housing, wherein said secondary latch arm engages said secondary catch when said fan module is located in its intermediate position and said secondary latch arm is selectively resiliently deflectable to disengage the secondary latch arm from the secondary catch;
wherein said fan module is selectively movable from said operative installed position where said fan module is operatively located relative to the housing to said intermediate position only by disengagement of the primary latch, and wherein said fan module is movable from said intermediate position to an opened position where said fan module is manually separable from the housing only by disengagement of the secondary latch;
said industrial automation controller further comprising a fan interface printed circuit board assembly connected to said housing, wherein said secondary catch is connected to said fan interface printed circuit board assembly.

14. The industrial automation controller as set forth in claim 13, wherein said processor monitors a speed at which said fan module operates and said processor initiates a minor fan speed fault condition if said speed is less than a select speed.

15. The industrial automation controller as set forth in claim 14, further comprising at least one visual indicator that changes state when said minor fan speed fault condition is initiated by said processor.

16. The industrial automation controller as set forth in claim 13, wherein said processor monitors a temperature within said housing and said processor changes a speed at which said fan operates based upon said temperature.

17. An industrial automation controller comprising:
a housing that includes a forced convection chamber;
a processor;
first and second fan modules releasably connected to the housing and operatively associated with the forced convection chamber such that the first and second fan modules are adapted to induce airflow through the forced convection chamber;
said first and second fan modules connected to the housing by respective first and second latch systems, each of said first and second latch systems comprising: (i) a primary latch that engages the fan module to the housing in an operative installed position of the fan module; and, (ii) a secondary latch that engages the fan module to the housing in an intermediate position of the fan module;
wherein each of the first and second fan modules is selectively movable from said operative installed position where the fan module is operatively located relative to the housing to an intermediate position only by disengagement of its respective primary latch, and wherein each of said first and second fan modules is movable from said intermediate position to an opened position where said fan module is manually separable from the housing only by disengagement of its respective secondary latch;
said industrial automation controller further comprising:
a fan interface printed circuit board assembly connected to said housing and comprising a plurality of primary electrical contacts, said fan interface printed circuit board assembly operably connected to said processor;
a plurality of fan module contacts connected to said first fan module;
wherein said primary contacts of said fan interface circuit board assembly respectively electrically mate with and engage said fan module contacts when said first fan module is located in its operative installed position for electrically connecting the first fan module to the fan interface printed circuit board; and,
wherein at least one of the primary contacts of the fan interface circuit board assembly and its respective mating fan module contact is configured as a make-last/break-first contact pair such that upon movement of said first fan module from its operative installed position to its intermediate position relative to said housing, said make-last/break-first contact pair is electrically disconnected while other fan module contacts remain electrically connected to their respective mating primary contacts such that disconnection of said make-last/break-first contact pair provides input to said processor that said first fan module has been moved from its operative installed position to its intermediate position.

18. The industrial automation controller as set forth in claim 17, wherein said processor monitors a speed at which each of said first and second fan modules operates and said processor initiates a minor fan speed fault condition if said speed is less than a select speed.

19. The industrial automation controller as set forth in claim 18, further comprising at least one visual indicator that changes state when said minor fan speed fault condition is initiated by said processor.

20. The industrial automation controller as set forth in claim 17, wherein said processor monitors a temperature within said housing and said processor changes a speed at which one or both of the first and second fan modules operates based upon said temperature within said housing.

\* \* \* \* \*